United States Patent [19]
McCarroll

[11] Patent Number: 5,331,210
[45] Date of Patent: Jul. 19, 1994

[54] DIFFERENTIAL CMOS PEAK DETECTION CIRCUIT

[75] Inventor: Benjamin J. McCarroll, Portland, Oreg.

[73] Assignee: Tektronix, Inc., Wilsonville, Oreg.

[21] Appl. No.: 32,032

[22] Filed: Mar. 16, 1993

[51] Int. Cl.[5] .............................................. H03K 5/24
[52] U.S. Cl. .................... 307/351; 307/359; 307/494
[58] Field of Search ............... 307/351, 353, 359, 494, 307/491; 328/151

[56] References Cited

U.S. PATENT DOCUMENTS

| | | | |
|---|---|---|---|
| 4,271,488 | 6/1981 | Saxe | 365/240 |
| 4,598,215 | 7/1986 | Schechtman et al. | 307/355 |
| 4,634,895 | 1/1987 | Luong | 307/350 |
| 4,808,848 | 2/1989 | Miller | 307/355 |
| 5,144,525 | 9/1992 | Saxe et al. | 365/45 |

OTHER PUBLICATIONS

Article, "Meeting 2-ns Pulse Capture Requirements" Joseph R. Peter Oct. 7, 1985 issue of Nikkei Electronics. pp. 9-12, FIGS. 5, 6, 7.

Primary Examiner—Timothy P. Callahan
Assistant Examiner—Terry L. Englund
Attorney, Agent, or Firm—Francis I. Gray

[57] ABSTRACT

A fully differential CMOS peak detection circuit has a differential input stage and a negative feedback loop that form a differential unity gain feedback amplifier. The differential output of the differential input stage is applied to a differential peak detect circuit having a pair of series diode/capacitor combinations. The diode/-capacitor junctions are applied to differential inputs of the negative feedback loop. A common mode correction circuit is coupled to the differential CMOS peak detection circuit to minimize differences between the common mode voltages of the differential input stage and the negative feedback loop. The differential peak voltage is held at the differential output of the differential input stage for sampling by a sampling circuit during a readback interval, and then tracks a differential input signal applied to the differential input of the differential input stage during a tracking interval. The differential peak detection circuit then peak detects during a peak detect interval that is equal to a desired sample time window.

9 Claims, 7 Drawing Sheets

DIFFERENTIAL CMOS PEAK DETECTION CIRCUIT

BACKGROUND OF THE INVENTION

The present invention relates to peak detection circuits, and more particularly to a wholly differential CMOS peak detection circuit that provides improved linearity, better noise immunity and less sensitivity to process variations.

Glitches and noise spikes are a common cause of problems in both analog and digital circuits. Modern oscilloscopes, such as digital storage oscilloscopes (DSO), need to be able to capture these narrow pulses to be useful in troubleshooting such circuits. Also such pulses may be as narrow as two nanoseconds (2 ns), which can trigger TTL circuitry, so the DSO needs to be able to obtain at least one sample of such a spike. When the time base of the DSO is adjusted so that the input signal is highly undersampled, the period between samples may be greater than the width of such spikes. Therefore the spikes may rarely or never be sampled. As a result peak detectors have been placed in the signal acquisition circuitry between the input and a digital sampler. In this way the minimum and maximum of the input signal within a specified time window is detected and held until they can be sampled or converted by an analog-to-digital converter (ADC).

An example of a prior art peak detector using bi-polar technology is present in the Tektronix 2430 DSO, manufactured by Tektronix, Inc. of Beaverton, Oreg., United States of America. The input signal is split into two opposite polarity signals that are fed into two positive and two negative peak detectors to allow detection of either positive or negative spikes. By using two peak detectors for each polarity, one can be peak detecting while the other is either holding for sampling or tracking. The peak detectors in this configuration peak detect for two intervals, hold for one interval and track for another interval before repeating the cycle, where two intervals are equal to a sample period. Each peak detector has an output stage for amplification prior to the sampling circuitry.

A peak detect cell for the Tektronix 2430 DSO is shown in FIG. 1 in the form of a simple unity gain feedback amplifier with a wide bandwidth. Transistors Q1–Q4 form a differential amplifier with a current source load I1. The output of the differential amplifier is fed back to the input through diode D and transistors Q5, Q6. When control signals S1, S2 are both low, the peak detector is in the detect mode. If the input signal Vin is greater than the output signal Vout, then capacitor C charges until Vin equals Vout. However if Vin is less than Vout, then diode D prevents the capacitor C from discharging so that Vout maintains the most positive value of Vin.

At the end of the detection period, the output signal is held and further inputs are ignored so that Vout may be sampled. At this point control signal S2 is high while S1 is still low to disconnect the input from the output. After Vout is sampled, control signal S2 is lowered and S1 is raised so that the diode D is bypassed while the input signal is enabled, and the capacitor is allowed to charge or discharge to track the input signal Vin. However bi-polar technology is relatively expensive and uses relatively high power, there is base current leakage from the storage capacitor C, there is a large offset due to the Darlington differential pair, there is no clamp of transistor Q3 (with the potential of saturation), there is excess delay around the closed loop (with the potential of ringing), and the circuit is single ended.

A CMOS based peak detector is disclosed in U.S. patent application Ser. No. 07/844,089, filed on Mar. 2, 1992 by Grigory Kogan and entitled "CMOS-BASED PEAK DETECTOR FOR FAST-IN, SLOW-OUT MIN/MAX DETECTION." CMOS technology is less expensive, more dense and uses less power than comparable bipolar technology, but is slower and must be configured differently to achieve high bandwidth operation. Referring to FIG. 2 two nodes A, B of a CMOS peak detector cell are coupled to a voltage rail Vdd during a precharge interval, after which they are disconnected. An acquire signal controls a switch Q1 that connects one node A to an input signal Vin, the one node being connected to the other node B by a transistor Q4 so that the capacitance C at the other node tracks the voltage at the first node. At the end of the acquisition interval the first node A is disconnected from the input signal Vin and the voltage on the other node B is held for transfer via a buffer amplifier AO to a sampler. Following transfer a clear signal connects the other node B to the voltage rail Vdd in preparation to repeat the cycle. However this circuit is relatively slow, the source follower Q4 has no current source so that point B dribbles down to one $V_T$ above point A producing a long tail, and the circuit is single ended.

What is desired is a CMOS peak detector circuit that is fully differential to provide the advantages of both differential circuitry and CMOS technology in a peak detector.

SUMMARY OF THE INVENTION

Accordingly the present invention provides a fully differential CMOS peak detector circuit that has a differential input stage for receiving a differential input signal. The differential input stage drives a differential output that is applied to a differential peak detect stage of two capacitors and two diodes. The differential peak detect stage provides a differential output at the capacitor/diode junctions which is applied to another differential input, closing a negative feedback loop. The negative feedback loop provides a differential output that is coupled to oppose the differential output of the differential input stage. The combination of the differential input stage and negative feedback loop forms a differential unity gain feedback amplifier. The output from the differential peak circuit is coupled to a differential output circuit that is coupled to a sampling circuit so that the differential peak voltage may be digitized during a readback cycle of the peak detection circuit. A common mode correction circuit is coupled to the differential unity gain feedback amplifier to provide compensation for differences between the common mode voltages of the differential input stage and negative feedback loop.

The objects, advantages and other novel features of the present invention are apparent from the following detailed description when read in conjunction with the appended claims and attached drawing.

DESCRIPTION OF THE PREFERRED EMBODIMENT

Figure 3:
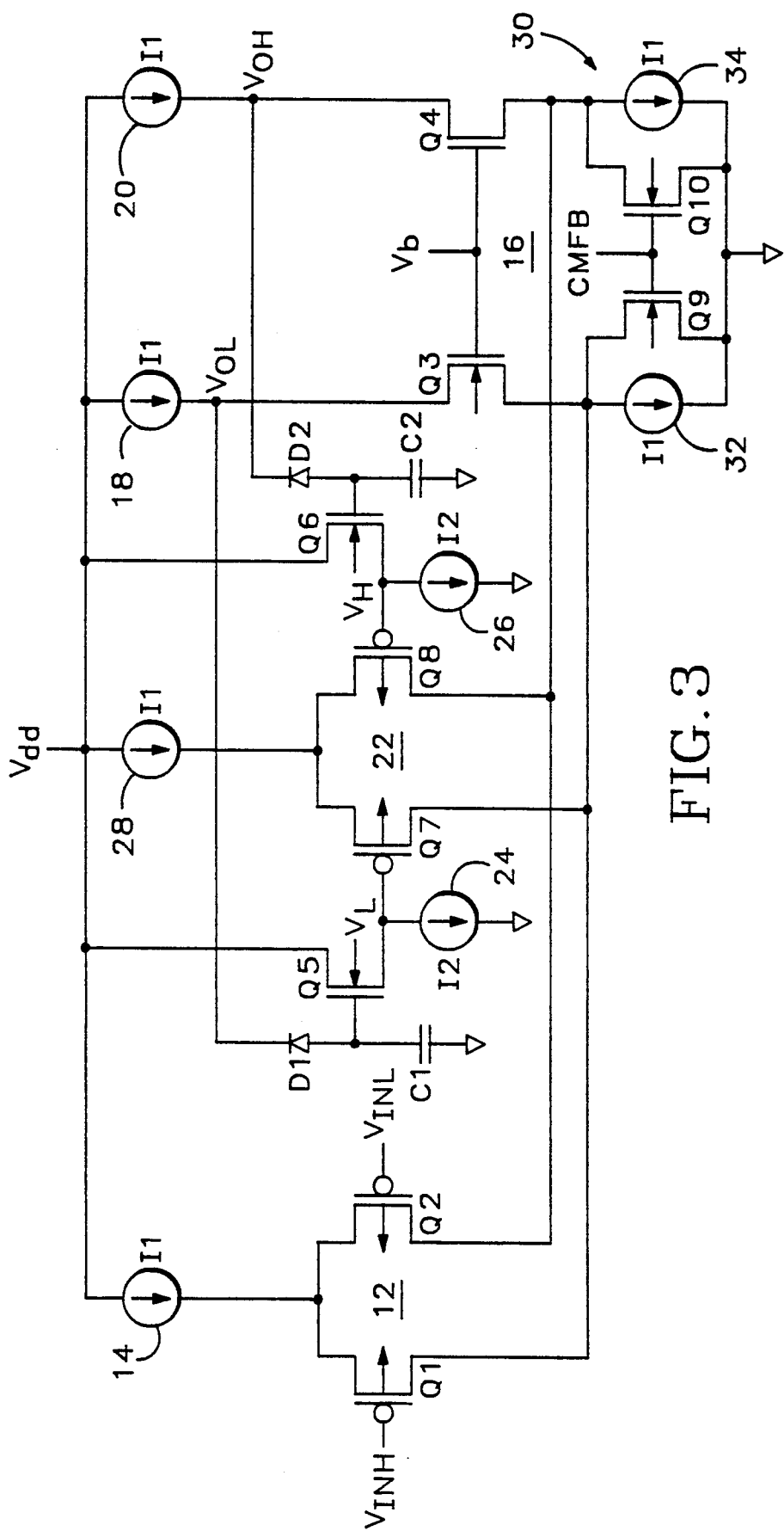
FIG. 3 is a schematic diagrammatic view of a first embodiment of the CMOS peak detector circuit according to the present invention.

Referring now to FIG. 3 a differential input circuit 12 has a pair of p-channel CMOS transistors Q1, Q2 with the sources coupled to a first constant current source 14 that provides a current I1. A differential input signal $V_{inH}$, $V_{inL}$ is applied across the respective gates of the transistors Q1, Q2. A folded cascode circuit 16 is coupled to the drains of the transistors Q1, Q2 in a folded cascode configuration. The folded cascode circuit 16 has a pair of n-channel CMOS transistors Q3, Q4 with the drains coupled to respective constant current sources 18, 20, each providing a current I1, and the sources coupled to the respective drains of the transistors Q1, Q2. A bias signal $V_b$ is applied to the gates of the transistors Q3, Q4. The drains of the transistors Q3, Q4 also are coupled to one end of respective opposite polarity diodes D1, D2. Respective capacitors C1, C2 are coupled in series between the other end of the diodes D1, D2 and ground.

The junctions between the diodes D1, D2 and the respective capacitors C1, C2 are coupled to the gates of respective n-channel CMOS source follower transistors Q5, Q6. The sources of the transistors Q5, Q6 are coupled as inputs to a differential feedback circuit 22 and to respective constant current sources 24, 26, each providing a current I2. The differential feedback circuit 22 has a pair of p-channel CMOS transistors Q7, Q8 having the sources coupled to a constant current source 28 that provides a current I1, the drains coupled to the drains of respective transistors Q1, Q2, and the gates coupled to the respective sources of transistors Q5, Q6.

A common mode correction circuit 30 is coupled to the differential input circuit 12, the folded cascode circuit 16 and the differential feedback circuit 22 at a common point. The common mode correction circuit 30 includes a pair of constant current sources 32, 34 coupled between the sources of folded cascode transistors Q3, Q4 and ground, each providing a current I1. In parallel with the current sources 32, 34 are respective n-channel CMOS transistors Q9, Q10 with the sources coupled to ground and the drains coupled to the respective drains of the input circuit transistors Q1, Q2 and the feedback circuit transistors Q7, Q8, and to the respective sources of the folded cascode transistors Q3, Q4. A common mode bias voltage CMFB, derived from the drains of the folded cascode transistors Q3, Q4 as described below, is applied in common to the gates of the common mode transistors Q9, Q10.

In operation changes in the input signal $V_{inH}$, $V_{inL}$ about the operating point of the input circuit 12 cause changes in the output currents, (I1)/2+/−dI, at the drain. The current changes are coupled through the folded cascode circuit 16 to one side of the diodes D1, D2. Depending upon the polarity of the change in the signal and the charge currently on the capacitors C1, C2, the diodes are either cut-off or conductive to allow the capacitors to track the peak value of the change. The change is fed back through the CMOS source followers Q5, Q6 and the differential feedback circuit 22 to provide a current at the junction between the differential feedback circuit and the differential input circuit 12 that cancels the change in current. Thus the current in each leg of the common mode correction circuit 30 is equal to 2I1, with one portion of the current equal to I1 coming from the combination of the outputs of the differential input and feedback circuits 12, 22 via current sources 14, 28 and the other portion of the current equal to I1 coming from the current sources 18, 20 via the folded cascode circuit 16. Any difference in common mode characteristics between the differential input and feedback circuits 12, 22 affect the current applied at the input of the common mode correction circuit 30, and are minimized by the common mode bias voltage CMFB applied at the gates of transistors Q9, Q10. In this particular embodiment the gain may vary with the input signal since the operational point for the differential input circuit is often at some value other than zero. Since the gain changes with input, the loop dynamics also change. This adversely affects the dynamic performance. However the common mode matching between the differential input and feedback circuits is not crucial in this embodiment.

Figure 4:
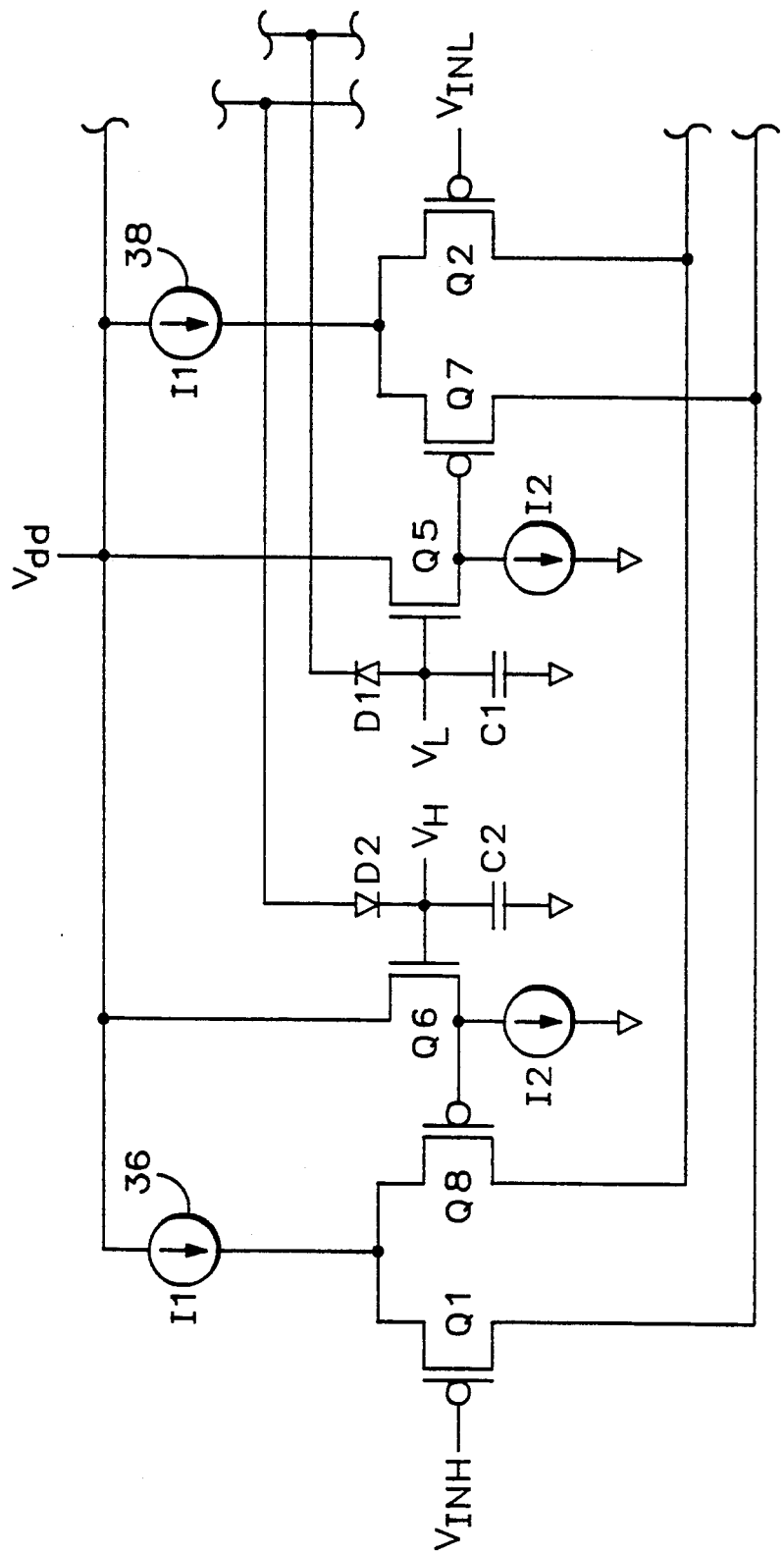
FIG. 4 is a schematic diagrammatic view of a second embodiment of the CMOS peak detector circuit according to the present invention.

An alternative embodiment is shown in FIG. 4. In this configuration the operating point of the differential circuits is at the zero point so that the gain is constant and the loop dynamics are constant. However the common mode matching between the feedback transistors Q7, Q8 and the input transistors Q1, Q2 is important. In this embodiment one transistor Q1 of the differential input pair has its source coupled to the source of one transistor Q8 of the differential feedback pair and to a constant current source 36 that provides a current I1. The other transistor Q2 of the differential input pair is likewise coupled to the other transistor Q7 of the differential feedback pair and to a constant current source 38 that provides a current I1. Otherwise the rest of the circuit is the same as for the embodiment of FIG. 3 and the operation is similar.

Figure 5:
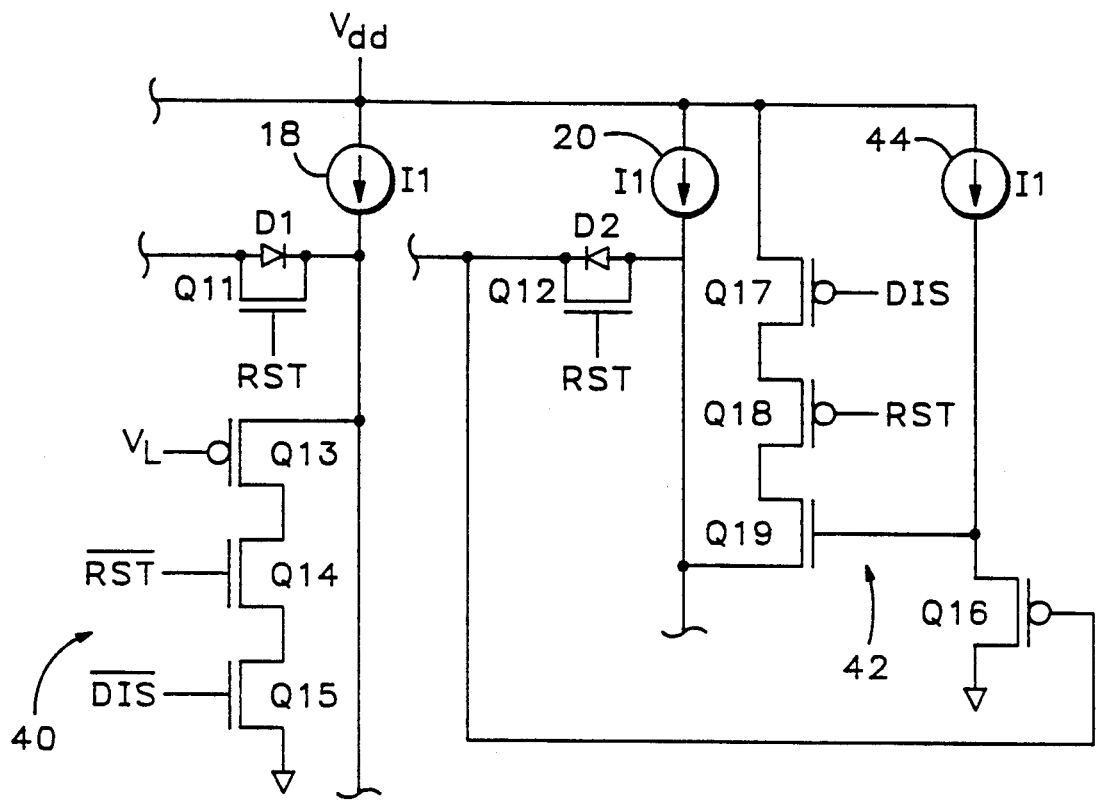
FIG. 5 is a schematic diagrammatic view of a clamp and reset circuit for the CMOS peak detector circuit according to the present invention.

FIG. 5 shows additional clamping and tracking circuitry that is added to the circuitry of FIGS. 3 and 4. N-channel CMOS transistors Q11, Q12 are coupled in parallel with respective diodes D1, D2. In response to a reset signal RST these bypass transistors Q11, Q12 essentially short out the diodes D1, D2 so that the capacitors C1, C2 track the differential input signal applied to the differential input circuit 12 in preparation for another peak detect cycle. Also clamping circuits 40, 42 are coupled between the drains of the respective folded cascode transistors Q3, Q4 and respective voltage rails, Vdd and ground. The low side clamping circuit 40 has three CMOS transistors Q13, Q14, Q15 coupled in series between the drain of transistor Q3 and ground, where the first transistor Q13 is a p-channel transistor and the others are n-channel transistors. The voltage $V_L$ at the gate of transistor Q7 of the differential feedback circuit 22 is coupled to the gate of the first transistor Q13, while the gates of the other transistors Q14, Q15 are coupled to inverted reset RSTn and disable DISn commands. The voltage at the junction of the second diode D2 and the second capacitor C2 is coupled to the gate of a p-channel transistor Q16 in the high side clamping circuit 42. The transistor Q16 has the source coupled to a constant current source 44 that provides a current I1 and the drain coupled to ground. A series of two p-channel transistors Q17, Q18 and an n-channel transistor Q19 are coupled between the other voltage rail Vdd and the drain of folded cascode transistor Q4. The source of the first transistor Q16 is coupled to the gate of the n-channel transistor Q19, and commands reset RST and disable DIS are coupled to the gates of the p-channel transistors Q17, Q18. The clamp circuits 40, 42 serve to couple the drains of the cascode transistors Q3, Q4 to the voltages held by the capacitors C1, C2 when the input peak is removed and the differential feedback loop opens.

Figure 6:
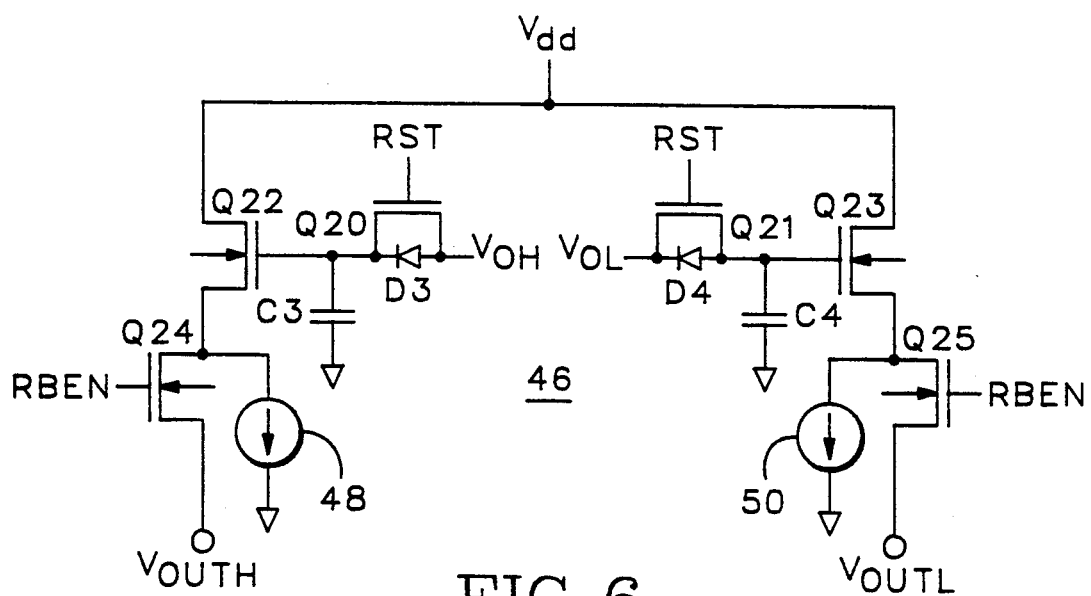
FIG. 6 is a schematic diagrammatic view of an output circuit for the CMOS peak detector circuit according to the present invention.

The drains of the folded cascode transistors Q3, Q4 are also coupled to an output stage 46, shown in FIG. 6. The output voltages $V_{oL}$, $V_{oH}$ are applied to series combinations of a diode D3, D4 and a capacitor C3, C4 coupled to ground to provide long term hold. N-channel transistors Q20, Q21 are coupled in parallel with the diodes D3, D4, and have the reset signal RST applied to their gates to bypass the diodes during the tracking cycle. The junctions between the diodes D3, D4 and the capacitors C3, C4 are coupled to respective gates of output n-channel source follower transistors Q22, Q23. The drains of the output source follower transistors Q22, Q23 are connected to the voltage rail Vdd and the sources are coupled to ground via respective current sources 48, 50. Also coupled to the sources of the output source follower transistors Q22, Q23 are the drains of respective output n-channel gate transistors Q24, Q25. The gates of the output gate transistors Q24, Q25 are coupled to a readback enable command RBEN that provides an output $V_{outH}$, $V_{outL}$ for a sampling circuit at the sources during the readback cycle.

Figure 1:
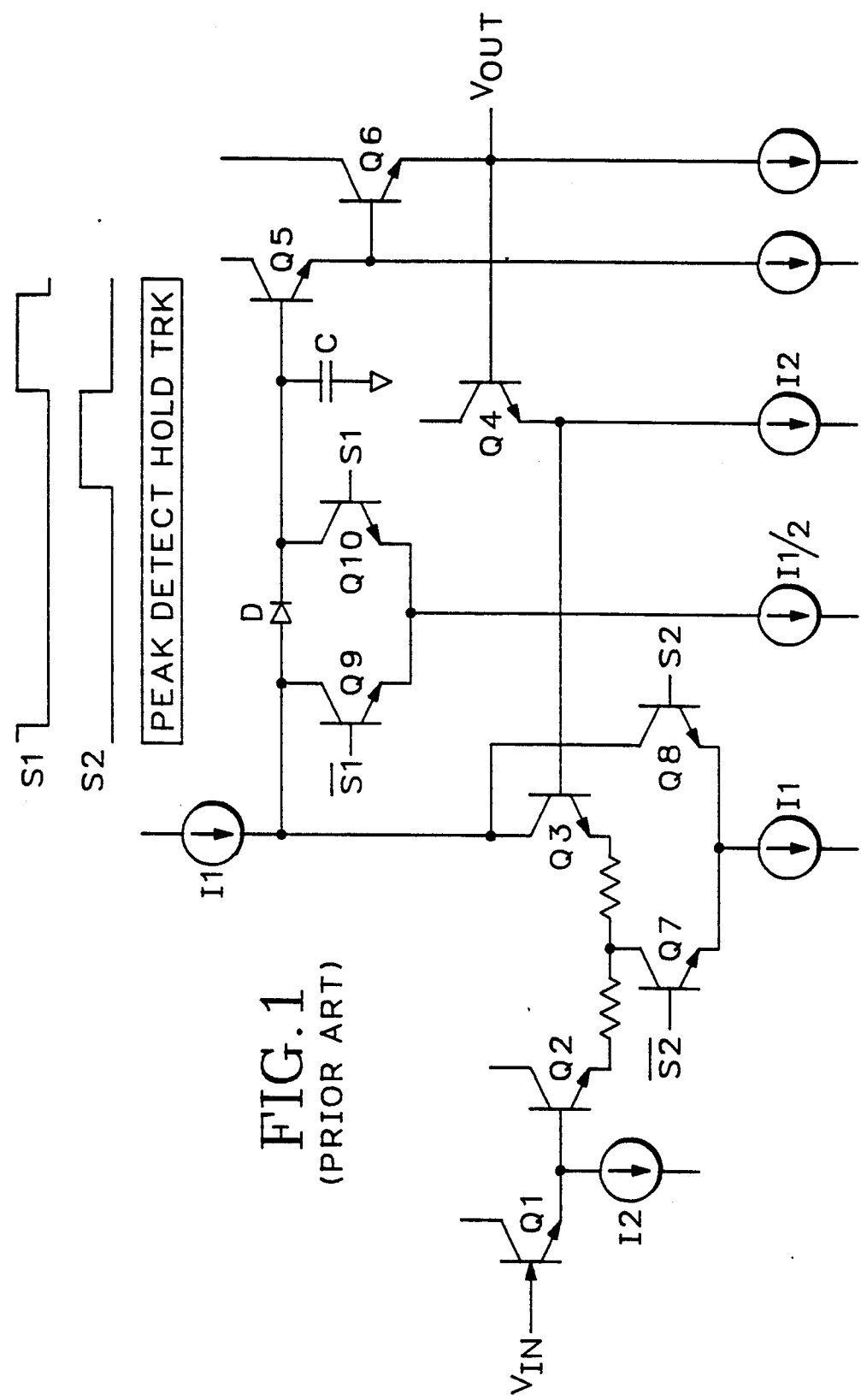
FIG. 1 is a schematic diagrammatic view of a prior art bipolar peak detector circuit.
Figure 2:
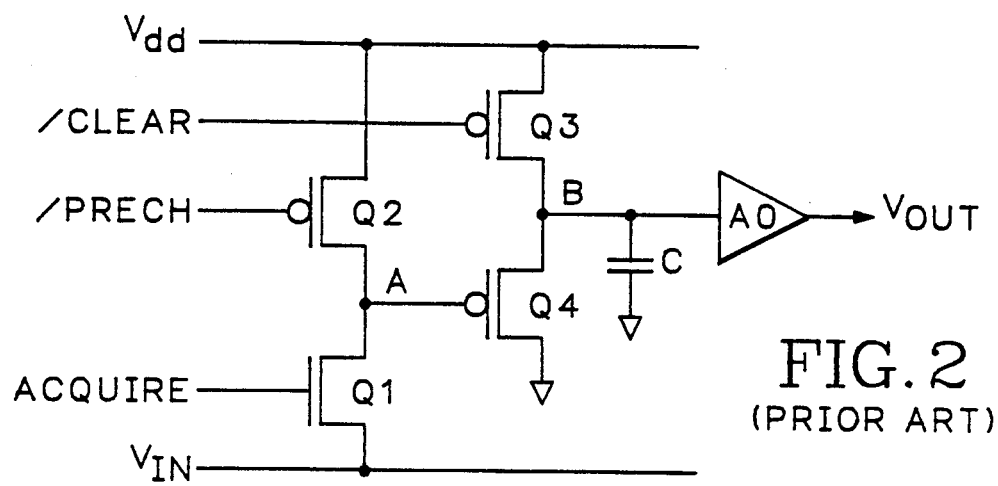
FIG. 2 is a schematic diagrammatic view of a prior art CMOS peak detector circuit.
Figure 7:
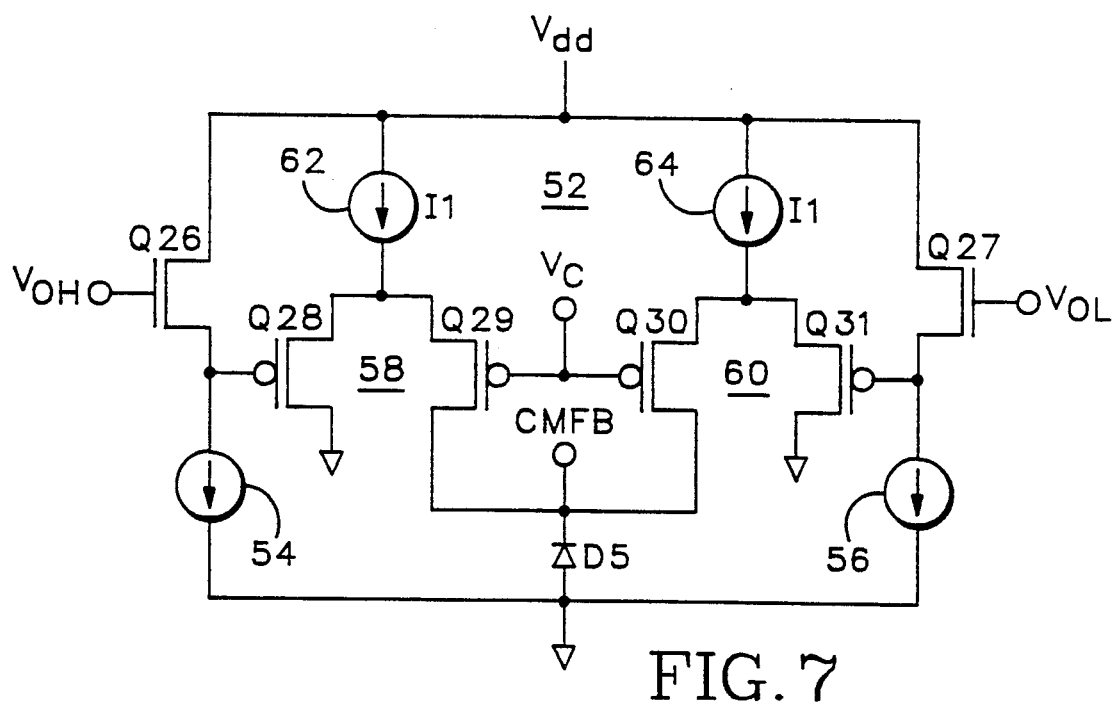
FIG. 7 is a schematic diagrammatic view of a common mode feedback circuit for the CMOS peak detector circuit according to the present invention.

The outputs $V_{oL}$, $V_{oH}$ from the folded cascode transistors Q3, Q4 also are applied to a common mode bias signal generator circuit 52, shown in FIG. 7. The inputs of the common mode bias generator circuit 52 are a pair of n-channel source follower transistors Q26, Q27, with the drains coupled to the voltage rail Vdd and the sources coupled via respective current sources 54, 56 to ground. The sources also are coupled to the gates of one input of respective p-channel differential circuits 58, 60, with the other gates being coupled together and tied to a common mode input bias, $V_C$. The transistors Q28, Q29 of the first differential circuit 58 have the sources coupled together to a constant current source 62, with the drain of transistor Q28 being coupled to ground. Likewise the transistors Q30, Q31 of the second differential circuit 60 have the sources coupled together to a constant current source 64, with the drain of transistor Q31 being coupled to ground. The gates of transistors Q28, Q31 are coupled to the sources of source follower transistors Q26, Q27 to receive the input signals $V_{oL}$, $V_{oH}$. The gates and drains of transistors Q29, Q30 are connected together, with the gates being connected to $V_C$ and the drains being coupled to ground through a diode D5. The common mode bias voltage CMFB is taken from the drains of transistors Q29, Q30 and applied to the gates of common mode correction transistors Q9, Q10.

Figure 8:
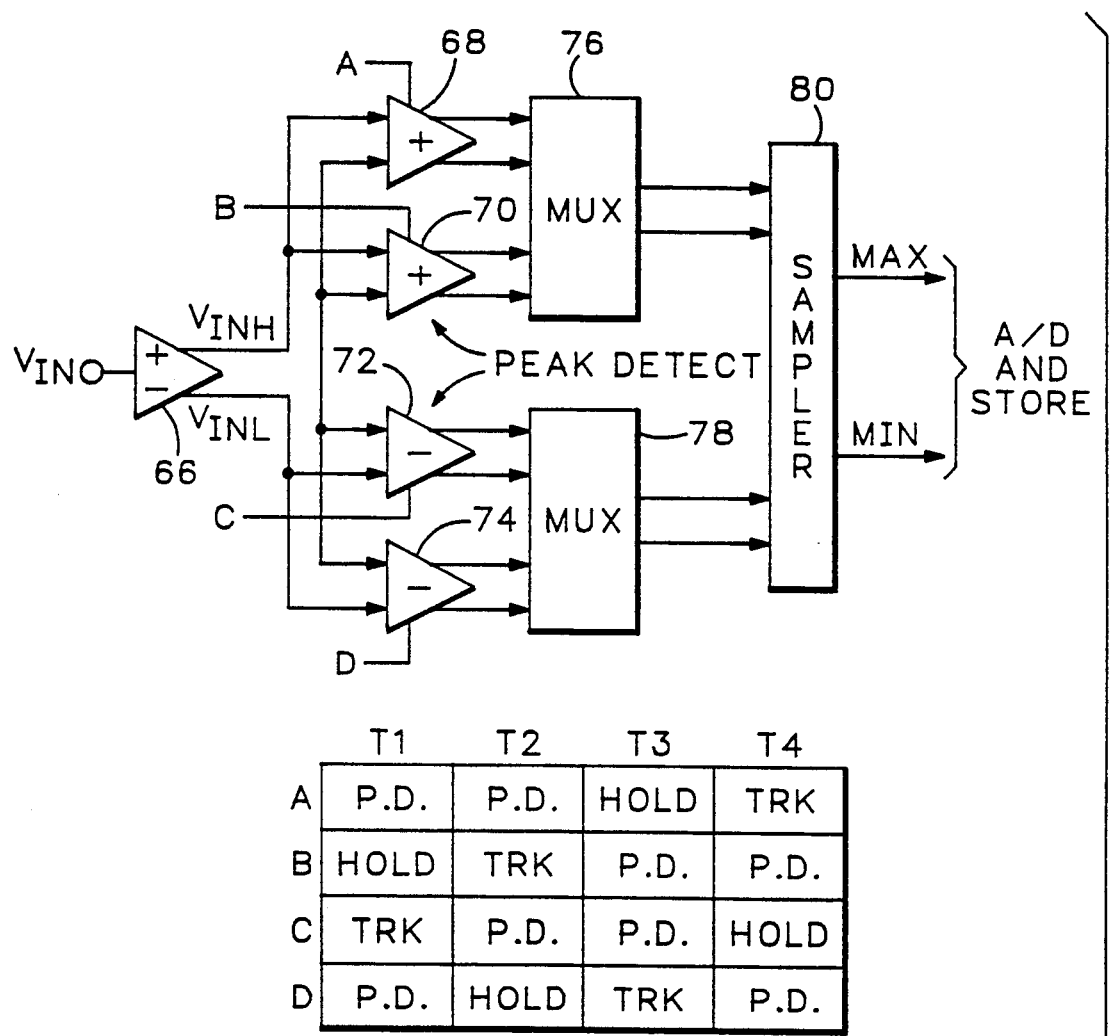
FIG. 8 is a block diagrammatic view of an acquisition system for an oscilloscope using CMOS peak detector circuits according to the present invention.
Figure 9:
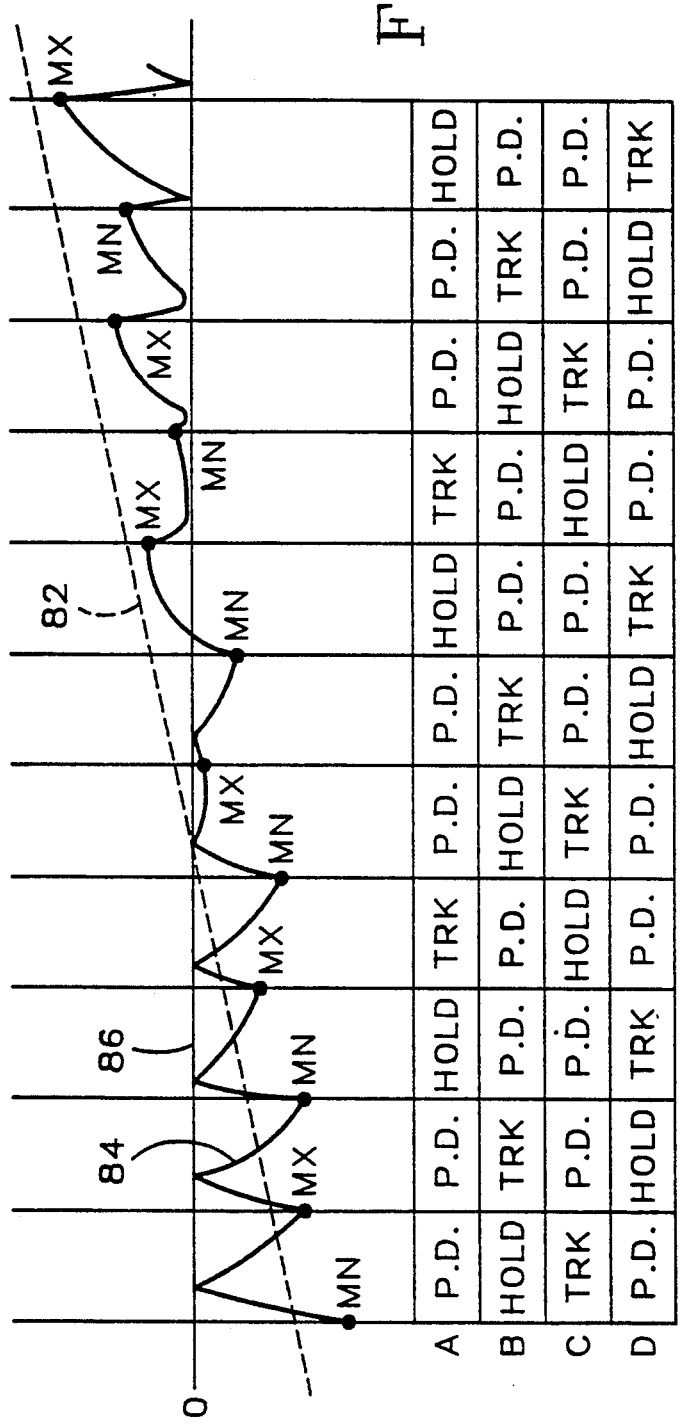
FIG. 9 is a graphic view of the operation of the acquisition system as shown in FIG. 8 using CMOS peak detector circuits according to the present invention.
Figure 10:
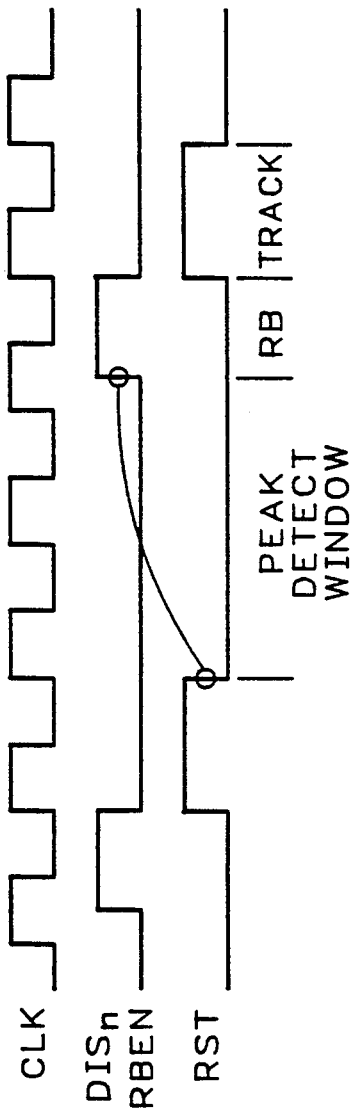
FIG. 10 is a timing diagrammatic view illustrating the operation of the CMOS peak detector circuit according to the present invention.

Referring now to FIG. 8 and the timing diagram of FIG. 10 an input signal Vin is input to a buffer amplifier 66 where it is converted into the differential signals $V_{inL}$, $V_{inH}$. These differential input signals are input to two positive peak detectors 68, 70 and two negative peak detectors 72, 74, each of which is a peak detection circuit as described above. The outputs of the peak detectors 68-74 are input to a positive and a negative multiplexer 76, 78 so that the output of the one peak detector that is in the readback cycle is applied to a sampler 80 for digitizing and storage as a maximum or minimum value during the sampling interval. This circuit operates in the same manner as that described for the Tektronix 2430 DSO above. As shown in FIG. 9 for an input signal that is a straight line 82 having a rising slope, indicated by the dotted line, a composite output signal 84 from the peak detectors provides alternating samples of maximums and minimums, with the output returning to the reference operating level 86 between respective sample points MN, MX.

Thus the present invention provides a fully differential CMOS peak detector that combines the advantage of CMOS and differential technologies.

What is claimed is:

1. A differential CMOS peak detector comprising:
    a differential input stage having a differential input and a differential output, a differential input signal being applied to the differential input;
    a differential peak detector circuit coupled to the differential output of the differential input stage to produce a differential peak output in response to the differential input signal;
    a negative feedback loop having a differential input and a differential output, the differential output being coupled in opposition to the differential output of the differential input stage and the differential input being coupled to receive the differential peak output from the differential peak detector circuit; and
    means coupled to the differential outputs of the differential input stage and the negative feedback loop to minimize common mode differences in response to a common mode bias signal derived from the differential peak output.

2. The differential CMOS peak detector as recited in claim 1 further comprising means coupled to the differential peak detector circuit for clamping the differential peak output during a second interval to a maximum value occurring during a first interval.

3. The differential CMOS peak detector as recited in claim 2 further comprising means coupled to the differential peak detector circuit for tracking the differential input signal at the differential peak output during a third interval.

4. The differential CMOS peak detector as recited in claim 1 further comprising means coupled to the differential peak detector circuit for generating the common mode bias signal as a function of the differential peak output.

5. The differential CMOS peak detector as recited in claim 2 further comprising an output stage coupled to the differential peak detector circuit for transferring the maximum value of the differential peak output to a sampling stage during the second interval.

6. The differential CMOS peak detector as recited in claim 1 wherein the differential input state comprises:
- a first CMOS transistor having a gate, drain and source;
- a second CMOS transistor having a gate, drain and source, the differential input signal being applied to the gates of the first and second CMOS transistors as the differential input, the sources of the first and second CMOS transistors being coupled together to a common first constant current source, and the drains providing the differential output.

7. The differential CMOS peak detector as recited in claim 6 wherein the negative feedback loop comprises:
- a third CMOS transistor having a gate, drain and source;
- a fourth CMOS transistor having a gate, drain and source, the differential peak output being applied to the gates of the third and fourth CMOS transistors, the sources being coupled together to a common second constant current source having a current equal to the current from the first constant current source, and the drains being coupled in opposition to the drains of the first and second CMOS transistors.

8. The differential CMOS peak detector as recited in claim 1 wherein the differential input stage comprises first and second CMOS transistors, each having a gate, source and drain, with the differential input signal being applied to the gates, each source being coupled to respective first and second constant current sources, and the drains providing the differential output.

9. The differential CMOS peak detector as recited in claim 8 wherein the negative feedback loop comprises third and fourth CMOS transistors, each having a gate, source and drain, with the differential peak output being applied to the gates, each source being coupled to the respective first and second constant current source and the source of the corresponding one of the first and second CMOS transistors, and each drain coupled to the drain of the opposite one of the first and second CMOS transistors to which the source is coupled.

* * * * *